United States Patent [19]
Huijsing et al.

[11] Patent Number: 5,486,790
[45] Date of Patent: Jan. 23, 1996

[54] MULTISTAGE AMPLIFIER WITH HYBRID NESTED MILLER COMPENSATION

[75] Inventors: Johan H. Huijsing, Schipluiden; Rudolphe G. H. Eschauzier, Spijenisse, both of Netherlands

[73] Assignee: Philips Electronics North America Corporation, New York, N.Y.

[21] Appl. No.: 365,332

[22] Filed: Dec. 23, 1994

Related U.S. Application Data

[63] Continuation of Ser. No. 197,529, Feb. 10, 1994, abandoned.

[51] Int. Cl.$^6$ .............................. H03F 3/45; H03F 1/34
[52] U.S. Cl. ......................... 330/260; 330/107; 330/294
[58] Field of Search ................................ 330/107, 109, 330/151, 260, 294; 307/520

[56] References Cited

U.S. PATENT DOCUMENTS

| | | | |
|---|---|---|---|
| 4,559,502 | 12/1985 | Huijsing | 330/294 |
| 4,591,805 | 5/1986 | Highton | 330/294 |
| 5,155,447 | 10/1992 | Huijsing et al. | 330/107 |

OTHER PUBLICATIONS

"A Programmable 1.5V CMOS Class–AB Operational Amplifier with Hybrid Nested Miller Compensation for 120 dB Gain and 6 MHz UGF" by Ruud G. H. Eschauzier, et al., IEEE Transaction of Solid Stte Circuits, vol. 29, No. 12, Dec. 1994.

"A CMOS Low–Distortion Fully Differential Power Amplifier with Double Nested Miller Compensation" by Sergio Pernici et al., IEEE Journal of Solid–State Circuits, vol. 28, No. 7, Jul. 1993, pp. 758–763.

"A Low–Output Impedance Fully Differential Op Amp with Large Output Swing and Continuous Time Common–Mode Feedback" IEEE Journal of Solid State Circuits, vol. 26, No. 12, Dec. 1991.

"A 100–MHz 100–db Operational Amplifier with Multipath Nested Miller Compensation Structure" R. Eschauzier et al., IEEE Journal of Solid–State Circuits, vol. 27, No. 12, Dec. 1992.

*Primary Examiner*—James B. Mullins
*Attorney, Agent, or Firm*—Steven R. Biren

[57] ABSTRACT

A high frequency amplifier circuit using hybrid nested Miller compensation (HNMC) as a means to frequency compensate amplifiers. The circuit comprises four amplifier stages, or any other even number higher than four. Each of the four stages can be inverting or balanced pair stages. The Miller compensation is provided by capacitors connected across the output and input of several of the stages, and with a third capacitor connected across the other stages. The HNMC circuit allows the use of lower supply voltages, consumes less supply power, and avoids the need to drive the output transistor with a differential stage. Other variations employ a multipath input stage, and opamps comprising 6 and 8 stages are also described.

19 Claims, 8 Drawing Sheets

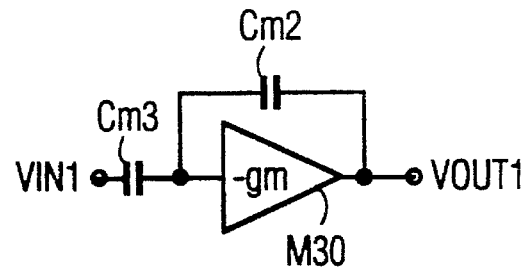
FIG. 4A1
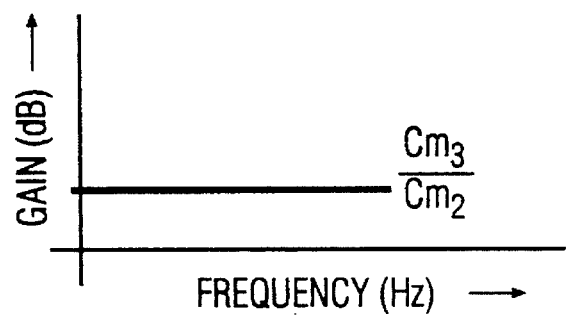
FIG. 4A2
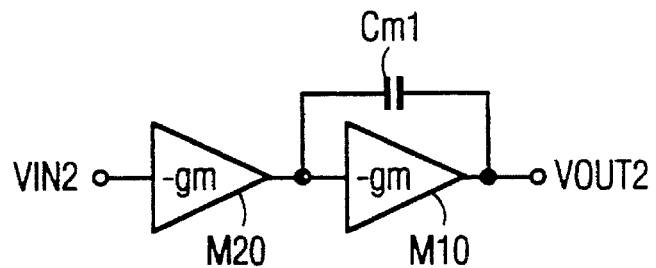
FIG. 4B1
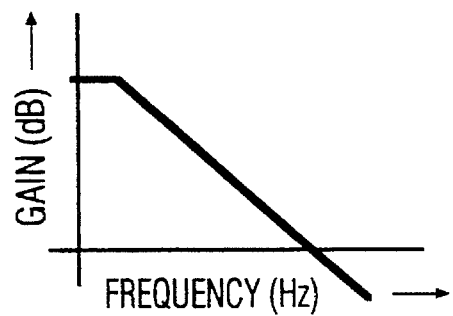
FIG. 4B2

MULTISTAGE AMPLIFIER WITH HYBRID NESTED MILLER COMPENSATION

This is a continuation of application Ser. No. 08/197,529, filed Feb. 10, 1994, now abandoned.

This invention relates to multistage amplifiers using hybrid nested Miller compensation to improve its high-frequency performance.

BACKGROUND OF THE INVENTION

Traditionally, CMOS operational amplifiers (opamps) apply cascoding techniques to ensure an acceptable gain with the minimum number of gain stages. The use of cascoding transistors, however, fundamentally limits the lowest supply voltage of a CMOS opamp. Considering that only one saturation voltage $V_{Dsat}$ (e.g., a current source) suffices to drive the output transistor, the minimum supply voltage of CMOS opamp circuits can be reduced to $V_{GS}+V_{Dsat}$. To obtain this minimum level no cascodes or differential stages can be used in the circuit to drive the output stage. The elimination of cascodes and differential stages to drive the output transistor poses severe demands on the frequency compensation of the amplifier.

Lowering the threshold voltage of the MOS process does not lead to a lower minimum supply voltage of the cascode circuits when a cascode is used between the gate and source of a transistor. To illustrate this, FIG. 1 shows a simplified schematic of a conventional opamp with a push-pull output stage. This is described in Bababezhad, J. N., 'A Low-Output-Impedance Fully Differential Op Amp with Large Output Swing and Continuous-Time Common-Mode Feedback', IEEE Journal of Solid State Circuits, vol. 26, no. 12, December 1991, whose contents are herein incorporated by reference. The circuit consists of an input differential pair M30/M35 and output stage M10/M20 separated by cascode transistors M21 and M24. The bold lines in FIG. 1 indicate the places where two stacked drain-source voltages are connected between the gate and the source of an output transistor. When the gate-source voltages of the output transistors drop below the summed saturation voltages of cascode transistors M11 plus M12 and M21 plus M22, the gain of the circuit drastically reduces.

This effect, which will render an important class of opamp circuits useless in the near future, is caused by the independence of the saturation voltage $V_{Dsat}$ of a MOS device from the threshold voltage $V_{th}$.

$$V_{Dsat} = V_{GS} - V_{th} = \sqrt{\frac{1}{k} \; \frac{L}{W} \cdot I_D} \quad (1)$$

To accommodate the two stacked drain-source voltages $V_{DS}$ of the cascodes M11/M12 and M21/M22, the W/L ratios of the cascode transistors have to be chosen high, as indicated by equation (1), and the W/L ratio of the output transistors low. The large cascode transistors increase the die area of the silicon chip, while the low W/L of the output transistors results in a large $V_{GS}$ and thus a high minimum supply voltage. In next generation CMOS processes, with lower threshold voltages, it will become even more critical, i.e., more difficult, to fit two stacked drain-source voltages into the gate-source voltage of an output transistor.

Also, CMOS amplifiers containing a differential gain stage to drive the output transistor suffer from restrictions similar to those of the cascode circuits. FIG. 2 shows an opamp with four cascaded gain stages and nested Miller compensation, described in Huijsing, J. H., 'Multi-stage amplifier with capacitive nesting for frequency compensation', U.S. Pat. No. 4,559,502, whose contents are herein incorporated by reference. In the circuit of that patent, to accomplish a correct sign for the Miller loops, the two intermediate stages, M30 and M40 are implemented as differential pairs. The bold lines in FIG. 2 reveal the voltage loop with two stacked saturation voltages between the gate and source of output transistor M20.

SUMMARY OF THE INVENTION

An object of the invention is an improved opamp circuit.

A further object of the invention is an improved opamp circuit capable of high gain and high frequency performance.

Still another object of the invention is an improved opamp circuit capable of high gain and high frequency performance and operating at lower supply voltages.

In accordance with one aspect of the present invention, an opamp circuit employs what we have termed hybrid nested Miller compensation (HNMC), a novel technique that is able to compensate amplifiers with four consecutive gain stages or any even number higher than four. Using HNMC, for example, a low-voltage class-AB rail-to-rail CMOS opamp is realized operating at a single supply voltage of 1.5 V. The unity gain frequency of the opamp is 2 MHz and the DC gain 120 dB, while the supply current amounts to 300 µA. Reducing the supply current to 15 µA, the circuit can be operated down to 1.1 V with a unity gain frequency of 200 kHz and 120 dB gain. The die area of the chip is only 0.05 mm². Also, a bipolar variation of the HNMC technique has been realized operating at IV. The resultant opamp proved to be simpler than existing low-voltage opamps and displayed a significantly reduced power consumption at a certain bandwidth.

In accordance with another aspect of the invention, the HNMC circuit of the invention comprises at least first, second, third, and fourth consecutive stages with the first, second, and third stages inverting stages. Each of the stages have input and output connections connected in cascade. Miller compensating capacitances are connected between the first inverting stage output and input, between the third inverting stage output and input, and between the first inverting stage output and the fourth stage output. The order of the four stages can be cyclically permutated between the input and output of the amplifier, as will be explained below.

In accordance with a still further aspect of the present invention, a further improvement is possible by incorporating a multipath input stage, i.e., a fifth stage having input and output connections, with said fifth stage input being connected to the input stage input in a manner such that the signal transfer of the fifth and fourth stages have the same signal transfer polarity, and with said fifth stage output being connected to the input of the output stage. This resulted in a CMOS opamp with a bandwidth of 6 MHz and a DC gain of 120 dB at a supply current of 300 µA.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

BRIEF DESCRIPTION OF THE DRAWINGS

FIGS. 4A1 and 4A2 are, respectively, a block diagram and Bode plot of part of the circuit of FIG. 3;

FIGS. 4B1 and 4B2 are, respectively, a block diagram and Bode plot of another part of the circuit of FIG. 3;

DETAILED DESCRIPTION OF THE PREFERRED EMBODIMENTS

In the circuit schematics of the figures to be described, the notation used has the following meaning. In all of FIGS. 1–10C, active MOS devices are labelled with the prefix M followed by a number and bipolar devices with the prefix Q followed by a number. Below the M label may appear a number/number, representing the W/L ratio of the MOS device in the usual way. The passive components use the usual notation to indicate values.

In FIGS. 1–6 the numbers following the M prefix represent an amplifier stage, with the 10 series the first stage, the 20 series the second stage, and so forth. In these figures, the stages are numbered from the output back toward the input. Components with the same identification number function the same or similarly. The Miller capacitors are denoted by Cm followed by a number. The circles with the horizontal line with an adjacent arrow represent a current source. The circles with the vertical line represent a voltage source.

Figure 7:
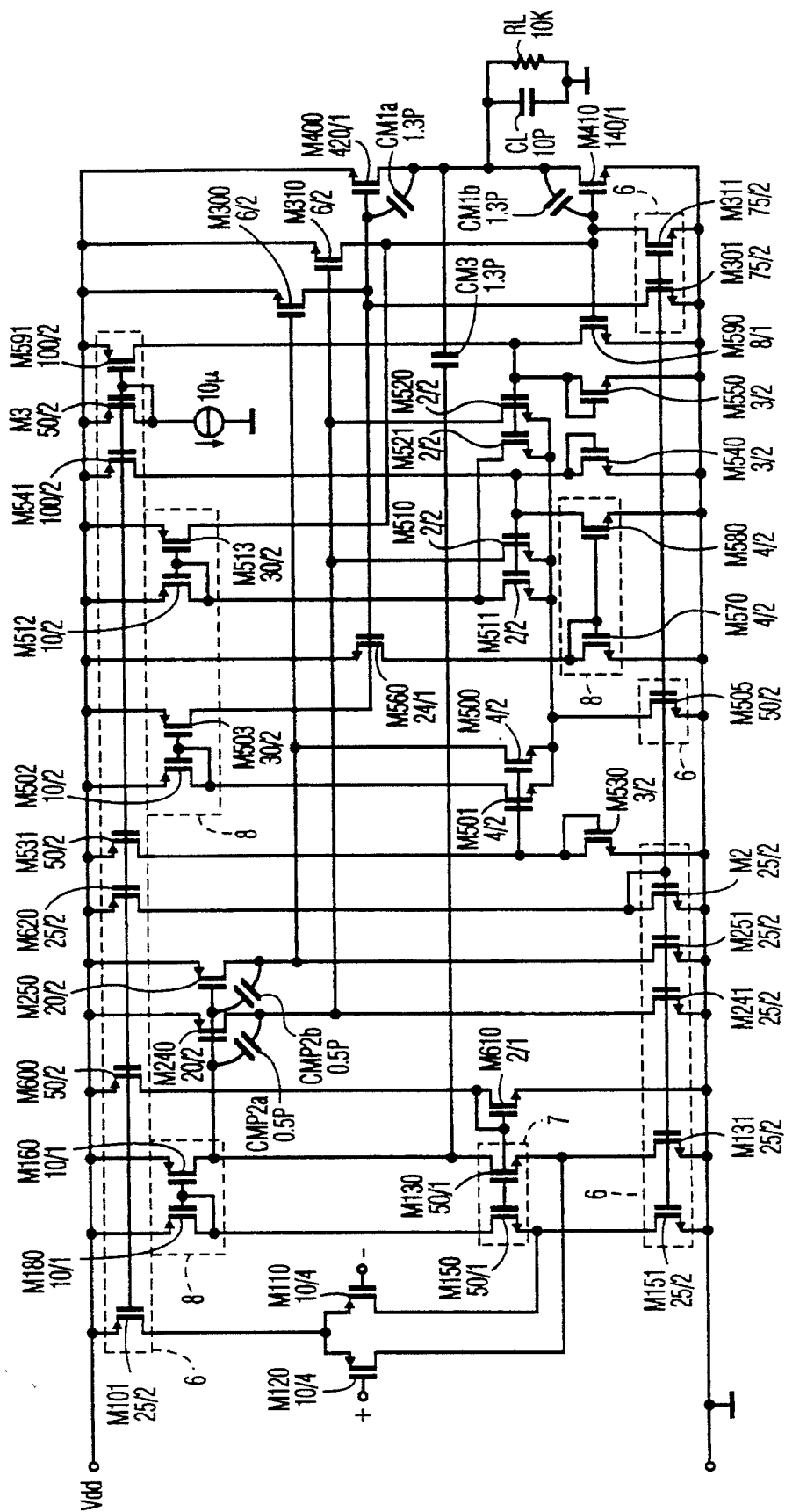
FIG. 7 is a circuit schematic of a CMOS opamp in accordance with the invention incorporating the principle as shown in FIG. 3.
Figure 8:
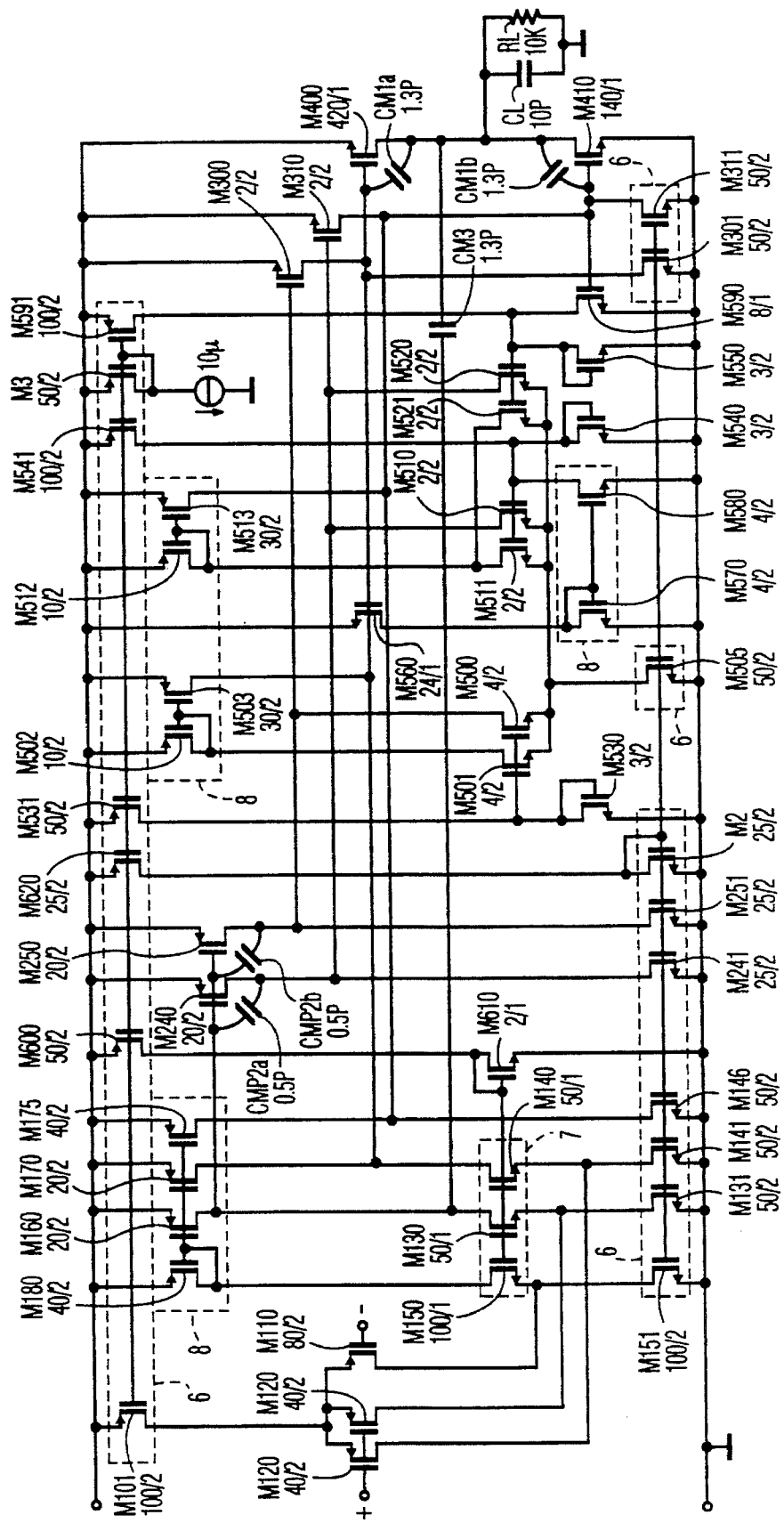
FIG. 8 is a circuit schematic of a CMOS opamp in accordance with the invention incorporating the principle illustrated in FIG. 6.
Figure 9:
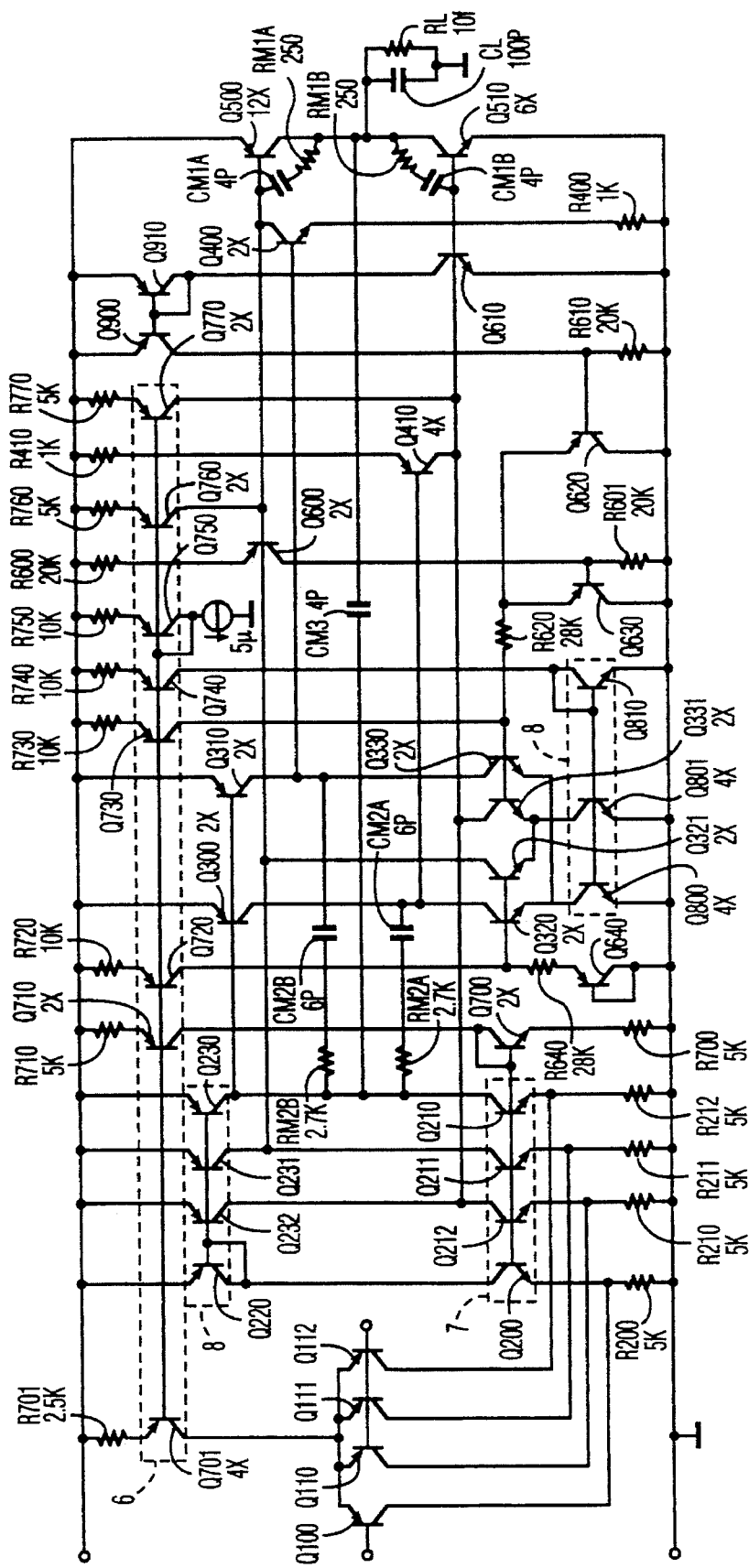
FIG. 9 is a circuit schematic of a bipolar opamp in accordance with the invention incorporating the principle illustrated in FIG. 6.

In FIGS. 7–9, the upper horizontal line would be connected to a source of DC potential serving as the supply voltage, and the lower horizontal line to a reference voltage such as ground.

Figure 3:
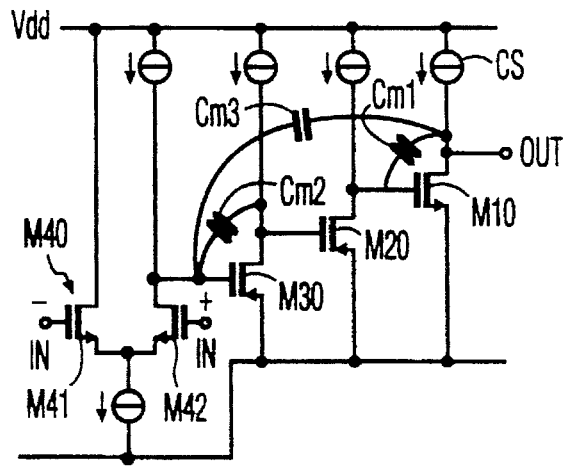
FIG. 3 is a circuit schematic of one form of an amplifier in accordance with the invention using hybrid nested Miller compensation to illustrate the principle of operation.

The principle of operation of the HNMC circuit of the invention is depicted in FIG. 3. It comprises a first output MOS inverter stage M10, driven by a second MOS inverting stage M20, in turn driven by a third MOS inverting stage M30, in turn driven by a fourth MOS differential stage M40—sometimes known as a balanced or long-tailed pair—having left M41 and right M42 transistors serving as negative and positive inputs for the amplifier. Current sources CS provide loads for each of the stages. Three feedback capacitors are used of which two, Cm1 and Cm2, are at the lowest nesting level. Capacitor Cm3 closes the outer loop. It can easily be verified that the feedback signs of all internal loops are correct. This is the case for the loops with Cm1 and Cm2, being ordinary Miller capacitors, but also Cm3 is part of a negative feedback loop because three inverting stages are present between its terminals. To maintain signal polarities correct, the fourth stage preferably is a non-inverting stage, such as a differential pair, so that the input is in phase with its output. While a circuit can be constructed in which the fourth stage is an inverting stage, this cannot be used with a non-inverting feedback circuit. The circuit illustrated in FIG. 3 having a non-inverting fourth stage can be used with a non-inverting feedback circuit and thus we prefer the latter.

Figure 1:
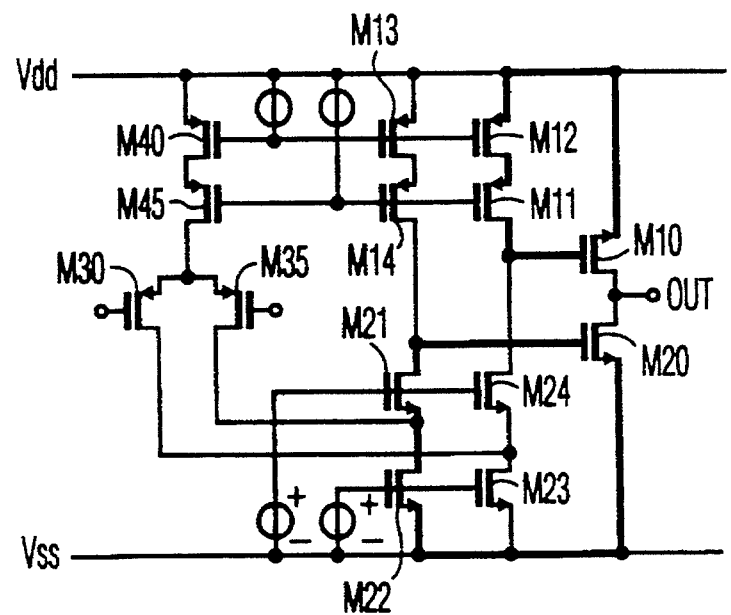
FIG. 1 is a circuit schematic of a conventional amplifier using cascodes to boost the gain.

FIGS. 4A1, 4A2, 4B1 and 4B2 explain the operation of the HNMC circuit of FIG. 3. In FIGS. 4A1 and 4B1, the transistors M10–M30 of FIG. 3 are represented by the three transconductors. Device M30 together with Miller capacitors Cm2 and Cm3 build up an inverting voltage amplifier which obeys:

$$\frac{V_{out1}}{V_{in1}} = \frac{C_{m3}}{C_{m2}} \quad (2)$$

Figure 2:
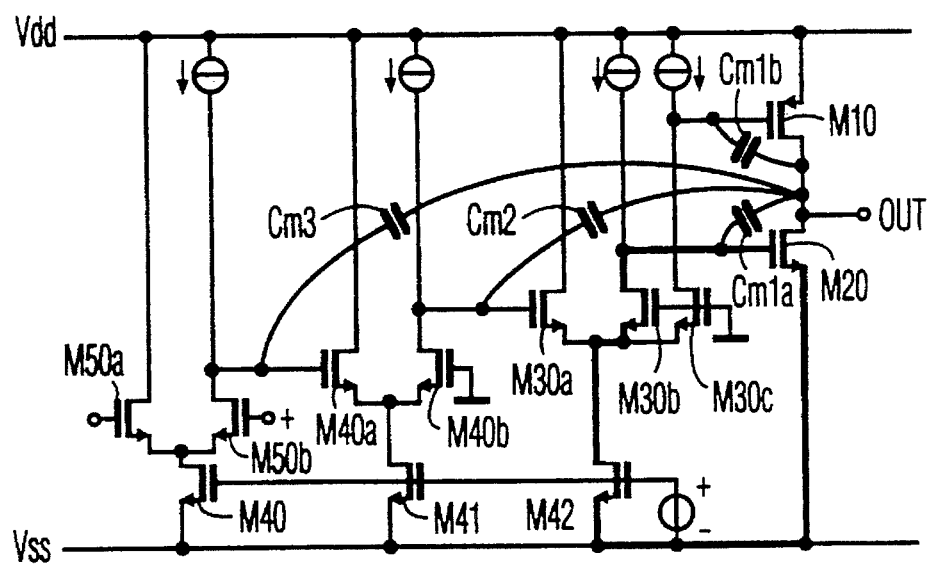
FIG. 2 is a circuit schematic of a known amplfier using nested Miller compensation.

The transfer characteristic of equation (2) is illustrated by the left hand Bode plot in FIG. 4A2.

Stages M20 and M10 form a structure similar to a two stage operational amplifier with simple Miller compensation. Device M20 serves as input stage converting the input voltage into a current, while M10 and the Miller capacitor Cm1 integrate this current and reconvert it into a voltage. The Bode plot of M10 and M20, which has one dominant pole, is shown in FIG. 4B2.

Connecting the two subcircuits of FIGS. 4A1 and 4B1 yields a transfer with a single dominant pole. This characteristic indicates that closing the main Miller loop results in a stable amplifier. The overall transfer from input to output of the HNMC circuit in FIG. 3 is determined by the transconductance of input stage M40 and outer Miller capacitor Cm3.

$$\frac{V_{out}}{V_{in}} = \frac{g_{m40}}{sC_{m3}} \quad (3)$$

Figure 5:
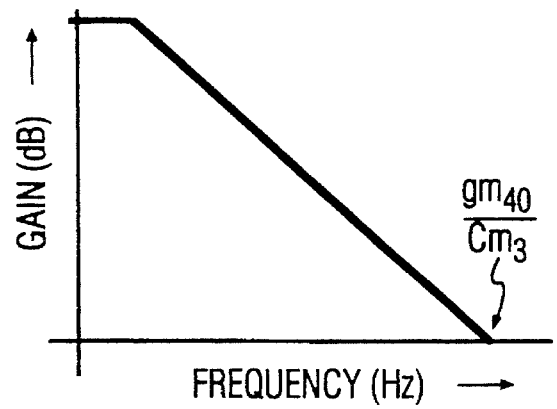
FIG. 5 is a Bode plot showing the effect of combining the several circuit parts of FIGS. 4A1 and 4B1.

The Bode plot of the overall circuit is presented in FIG. 5.

Figure 6:
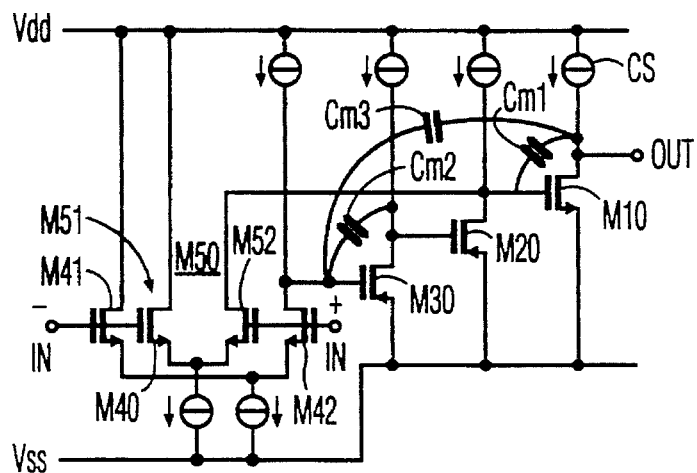
FIG. 6 is a circuit schematic of another form of an amplifier in accordance with the invention using multipath hybrid nested Miller compensation to illustrate the principle of operation.

FIG. 6 shows a further improvement. By introducing an additional multipath input stage to the HNMC structure of FIG. 3, the unity gain frequency can theoretically be doubled. The multipath feature, as such, is described in detail in Eschauzier, R. G. H., Kerklaan, L. P. T., Huijsing, J. H., 'A 100-MHz 100 dB Operational Amplifier with Multipath Nested Miller Compensation Structure.', IEEE Journal of Solid State Circuits, vol 27, no 12 December 1992, the contents of which are hereby incorporated by reference herein.

The simplified circuit with a multipath input stage is shown in FIG. 6, and comprises the HNMC amplifier of FIG. 3 with an added fifth input non-inverting stage, M50, with left and right transistors M51, M52 forming a long-tailed balanced pair of the same signal polarity as that of the fourth stage M41, M42 and with which its inputs are connected in common. The output of the fifth stage directly drives via connection 9 output transistor M10 in accordance with the principle described in the referenced publication.

Three operational amplifier circuits have been realized to demonstrate the virtues of the HNMC principle alone and with the added multipath feature. In addition to a bipolar opamp with the HNMC structure, two CMOS amplifiers with HNMC and multipath HNMC were constructed and their performance measured. Their circuits are shown in FIGS. 7–9.

FIG. 7 shows the total circuit of the CMOS opamp with HNMC. Many details comprise conventional components or combinations of components performing common functions. These have been boxed in dashed lines and their function described. Others are performing obvious functions that require no further description to understand the circuit operation. The components or component combinations in FIG. 7 that correspond in function to the components illustrated in the simplified schematic of FIG. 3 are listed in Table I below:

TABLE I

| FIG. 3 | FIG. 7 |
| --- | --- |
| M10 | M400 and M410 |
| M20 | M300 and M310 |
| M30 | M240 and M250 |
| M40 | M110 and M120 |
| Cm1 | Cm1a and Cm1b |
| Cm2 | Cm2a and Cm2b |
| Cm3 | Cm3 |

The components in dashed box 6 are biasing transistors for the active devices. The components in dashed box 7 form cascode transistors. The components in dashed box 8 form current mirrors. The CMOS opamp circuit of FIG. 7 exhibited a unity gain frequency of 2 MHz and a gain of 120 dB at a supply voltage of 1.5 V and a supply current of 300 µA.

Adding the multipath input stage, indicated in the FIG. 8 schematic, the unity gain frequency of the circuit increased to 6 MHz. In this CMOS opamp circuit, similar to FIG. 7, the components in the dashed box 6 are biasing transistors for the active devices; the components in the dashed box 7 form cascode transistors; and the components in the dashed box 8 form current mirrors. The components or component combinations that correspond in function to the components illustrated in the simplified schematic of FIG. 6 are listed in Table II below:

TABLE II

| FIG. 6 | FIG. 8 |
| --- | --- |
| M10 | M400 and M410 |
| M20 | M300 and M310 |
| M30 | M240 and M250 |
| M40 | M110 and M120 |
| M50 | M100 |
| Cm1 | Cm1a and Cm1b |
| Cm2 | Cm2a and Cm2b |
| Cm3 | Cm3 |

Changing the bias currents of the CMOS opamps, their characteristics can be programmed. The multipath HNMC circuit of FIG. 8, for example, can be set to operate at a total supply current of 15 µA. The minimum supply voltage in that case reduces to 1.1 V, giving a total power consumption of 17 µW. The unity gain frequency under these conditions is 0.5 MHz.

Due to the steeper, exponential characteristic of bipolar transistors as compared to their MOS counterparts, using bipolar technology the minimum supply voltage of HNMC circuits can be reduced to 1 V. FIG. 9 shows the circuit diagram of one such opamp. As with the other figures, the components in the dashed box 6 are biasing transistors for the active devices; the components in the dashed box 7 form cascode transistors; and the components in the dashed box 8 form current mirrors. The components or component combinations that correspond in function to the components illustrated in the simplified schematic of FIG. 6 are listed in Table III below:

TABLE III

| FIG. 6 | FIG. 9 |
| --- | --- |
| M10 | Q500 and Q510 |
| M20 | Q400 and Q410 |
| M30 | Q310 and Q320 |
| M40 | Q100 and Q112 |
| M50 | Q110 and Q111 |
| Cm1 | Cm1a and Cm1b |
| Cm2 | Cm2a and Cm2b |
| Cm3 | Cm3 |

The unity gain frequency of the bipolar opamp of FIG. 9 is 3.5 MHz and the supply current is 250 µA.

In the FIGS. 7–9 circuits, the load is represented by capacitor CL and resistor RL. Also, all three amplifiers have the usual differential circuit inputs and single-ended output. Since the outputs are totem poled, as is clear from Tables I, II and III, each of the stages in the simplified schematic are represented by dual stages, thus, in FIG. 7, for the output stage, by M400 and M410, and so on. In FIGS. 7 and 9, every stage is doubled except for the third Miller capacitor which is common to both sets of stages. The same is true for the FIG. 8 circuit except for the multipath stage which is common for both.

Figure 10A:
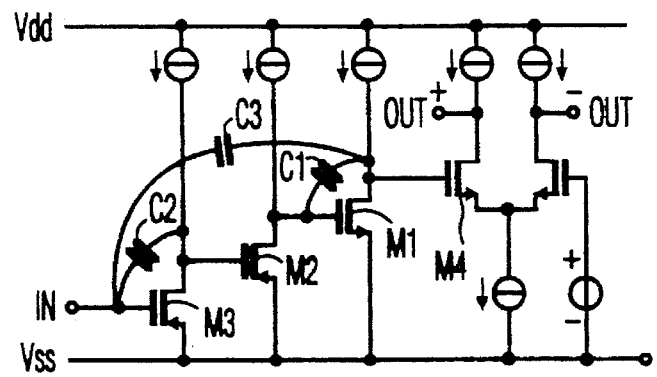
FIGS. 10A, 10B and 10C are schematics illustrating variants in accordance with the invention of the circuit illustrated in FIG. 3.

In the MOS circuit illustrated in FIG. 3, the stage labelled M10 is the output stage and the stage labelled M40 is the input stage, and the consecutive intermediate stages are labelled such that the order from right to left of the consecutive inverting stages is M10–M20–M30–M40. The invention is not limited to the stage labelled M10 being the output and the stage labelled M40 being the input, and the Miller capacitors connected at the locations shown. However, it will be noted that capacitor Cm1 is connected between the output and input of inverting stage M10, and capacitor Cm2 is connected between the output and input of inverting stage M30, and capacitor Cm3 is connected between the output of inverting stage M10 and the input of inverting stage M30. This cyclical order can be retained and the stages rearranged within the scope of the invention. This is illustrated in FIGS. 10A–10C.

To see the relationship between these figures and FIG. 3, the inverting stages are labelled with M followed by a number that corresponds to the labelling used in FIG. 3; thus M1 corresponds to M10, M2 corresponds to M20, and so forth. Similarly, the Miller capacitors have been correspondingly labelled so that C1 corresponds to Cm1, C2 corresponds to Cm2, and so on. The cyclical rearrangement will thus be evident. In FIG. 10A, the output stage is M4 and the input inverting stage is M3, but capacitor C1 is still connected between the output and input of inverting stage M1, capacitor C2 between the output and input of inverting stage M3, and capacitor C3 between the output of inverting stage M1 and the input of inverting stage M3.

Figure 10B:
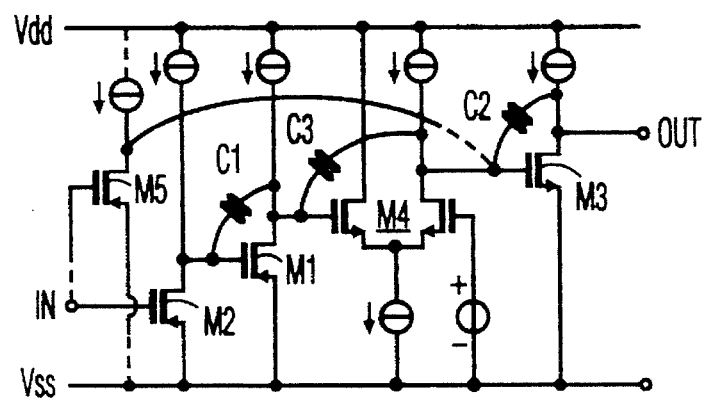

In the same manner, in FIG. 10B, the output inverting stage is M3 and the input inverting stage is M2, but capacitor C1 is still connected between the output and input of inverting stage M1, capacitor C2 between the output and input of inverting stage M3, and capacitor C3 between the output of inverting stage M1 and the input of inverting stage M3. As was done in conection with the FIG. 6 embodiment, a fifth stage M5 can be added to the FIG. 10B circuit with the fifth stage input being connected to the input of the amplifier at the second stage M2, and the fifth stage output being connected to the input of the stage M3 at the amplifier output. In this arrangement, the fifth stage must be of the same signal polarity as the second stage M2 at the amplifier input.

Figure 10C:
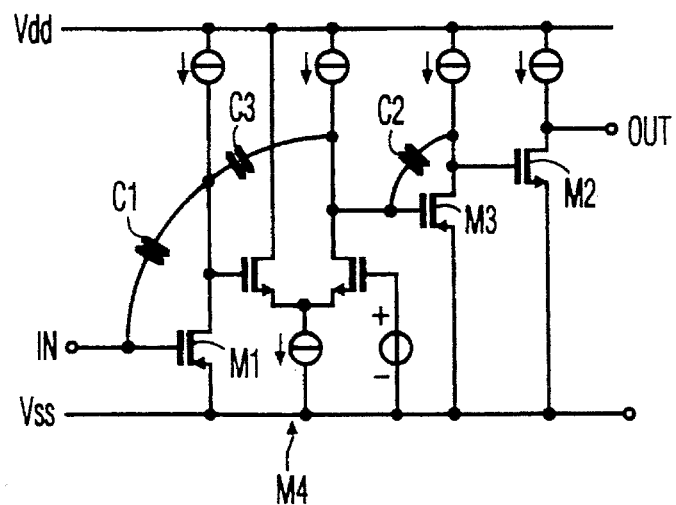

In the same manner, in FIG. 10C, the output inverting Stage is M2 and the input inverting stage is M1, but capacitor C1 is still connected between the output and input of inverting stage M1, capacitor C2 between the output and input of inverting stage M3, and capacitor C3 between the output of inverting stage M1 and the input of inverting stage M3.

In the variants of FIGS. 10A–10C, in addition to the fourth stage, each of the other stages may also be balanced. In the circuits of FIGS. 10B and 10C, the fourth stage M4 must be a balanced stage to maintain the correct internal sign of the feedback.

The same principle can be applied to the bipolar version to allow cyclical rearrangement of the stages while retaining the benefits of the invention. In addition, it will be appreciated that the MOS stages can, if desired, be replaced by bipolar stages.

While the invention has been illustrated in connection with a 4-stage amplifier, it will be clear that the four consecutive stages can be incorporated in any amplifier containing an even or odd number of stages exceeding 4 in number providing four consecutive ones are connected up as shown and described. In the latter case, the four stages illustrated in FIGS. 3 and 7, and 10 can be present as the first four stages of the amplifier, or as the last four stages of the amplifier, or as the intermediate four stages of the amplifier. When an additional stage is added to implement the multipath feature, illustrated in FIGS. 6, 8 and 9, it will be noted that the amplifier still comprises 4 consecutive inverting stages connected up as illustrated in FIG. 3. They can also be cyclically rearranged as described in connection with FIGS. 10A–10C. If a 6-stage or higher even numbered stage HNMC opamp is constructed, four consecutive stages corresponding to M10–M40 would be connected up as described, and the two or four additional stages could be provided with Miller compensating capacitors following the principles described herein.

Figure 11A:
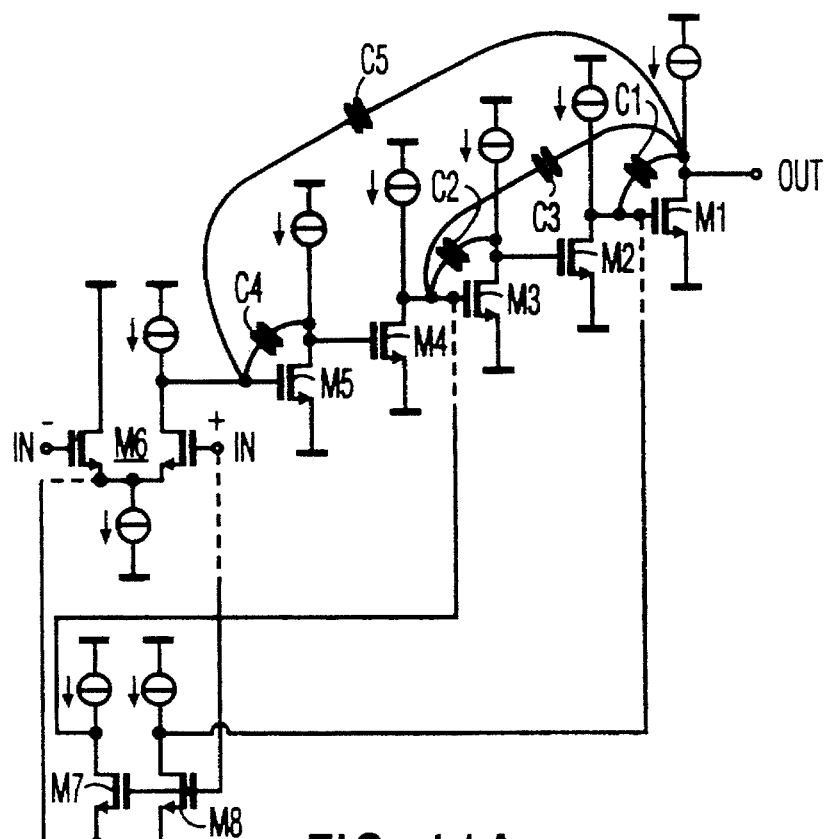
FIGS. 11A and 11B show schematics extending the principles of HNMC to six and eight stage amplifiers.
Figure 11B:
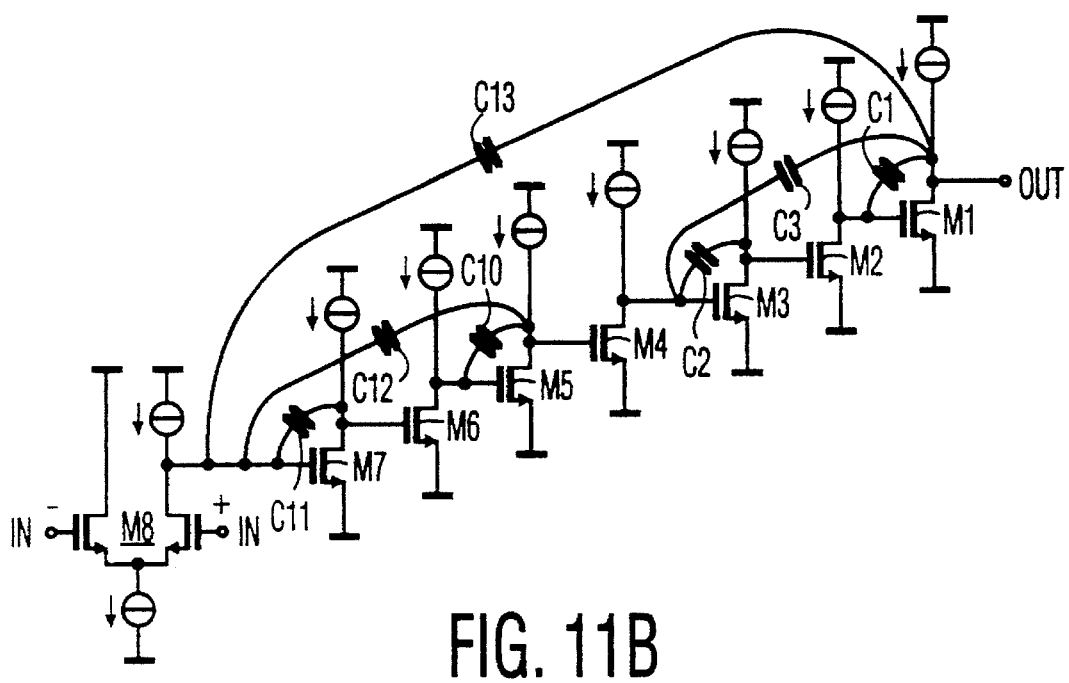

Circuits extending the principles described above to 6- and 8-stage amplifiers are illustrated in FIGS. 11A and 11B, in which the same notation is used as in the variants of FIGS. 10A–10C. The 6-stage amplifier illustrated in FIG. 11A is a straightforward extension of the HNMC principal, in which the fifth stage, M5, can be an inverting stage with a Miller capacitor C4 connected between its input and output, and with a Miller capacitor C5 connected between the output of the balanced pair input stage M6 and the output of the first stage M1.

In the variation illustrated in FIG. 11B, which we call recursive HNMC, it will be seen that the capacitor connections on the right hand side are mirrored by the capacitor connections on the left hand side, so that C10 corresponds to C1, C11 corresponds to C2, and C12 corresponds to C3, with an additional Miller capacitor C13 directly connected between the output of the balanced pair input stage M8 and the output of the first stage MI.

Additional seventh and eighth stages M7 and M8 can also be added to the FIG. 11A embodiment, in which case the inputs of both the seventh and eighth stage inputs are connected to the input of the amplifier at stage M6, the seventh stage output is connected to the third stage M3 input, and the eighth stage output is connected to the first stage M1 input. Also, in this case the seventh and eighth stages must be of the same signal polarity as the sixth stage.

In all three figures, the upper horizontal lines represent Vdd and the bottom horizontal lines Vss. The usual biasing and load components are not shown for simplicity.

The FIG. 3 circuit operates in a voltage mode, because the input presents a high impedance and is voltage driven by the voltage difference between the positive and negative inputs, whereas the output looks like a low impedance and a current source. The circuit of FIG. 10B behaves similarly in a voltage mode. The circuits of FIGS. 10A and FIG. 10C, on the other hand, operate in a current mode. because the capacitor nesting at the input provides a virtual low impedance and the output behaves as an open drain with high impedance.

The values of the Miller capacitors used in the circuits depicted are chosen in accordance with the principles described above to obtain the desired operation. In general, the values will be chosen in accordance with the following equations, where $C_{load}$ is the load capacitance of the first stage.

$$\frac{gm_2}{Cm_1} \leq \frac{1}{2} \cdot \frac{gm_1}{C_{load}} \cdot \frac{Cm_2}{Cm_3} \qquad (4)$$

$$\frac{gm_4}{Cm_3} \leq \frac{1}{2} \cdot \frac{gm_2}{Cm_1} \cdot \frac{Cm_3}{Cm_2} \qquad (5)$$

In addition to the other advantages described above, the opamp of the invention is easily implemented as an IC using standard NMOS, CMOS and bipolar technology.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A high-quality amplifier circuit having an input and an output and comprising:

(a) a first stage having input and output connections;
 (b) a second stage having input and output connections;
 (c) a third stage having input and output connections;
 (d) a fourth stage having input and output connections;
 (e) a first Miller capacitor connected between the first stage output and input;
 (f) a second Miller capacitor connected between the third stage output and input;
 (g) a third Miller capacitor connected between the first stage output and the third stage input;
 (h) said first, second, and third stages being inverting stages; and
 (i) means for intercoupling given respective ones of said input and output connections so as to form said high-quality amplifier circuit;
 wherein said fourth stage has at least one non-inverting input, said first stage being inverting and its output serving as the amplifier output, said second stage being inverting and its output being connected to the first inverting stage input, said third stage being inverting and its output being connected to the second inverting stage input, said fourth stage output being connected to the third inverting stage input, said fourth stage input serving as the amplifier input.

2. A high-quality amplifier circuit having an input and an output and comprising:

(a) a first stage having input and output connections;
 (b) a second stage having input and output connections;
 (c) a third stage having input and output connections;
 (d) a fourth stage having input and output connections;
 (e) a first Miller capacitor connected between the first stage output and input;
 (f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

wherein said fourth stage has at least one non-inverting input, said fourth stage output serves as the amplifier output, said first stage being inverting and its output being connected to the fourth stage input, said second stage being inverting and its output being connected to the first inverting stage input, said third stage being inverting and its output being connected to the second inverting stage input, said third inverting stage input serving as the amplifier input.

3. A high-quality amplifier circuit having an input and an output and comprising:

(a) a first stage having input and output connections;

(b) a second stage having input and output connections;

(c) a third stage having input and output connections;

(d) a fourth stage having input and output connections;

(e) a first Miller capacitor connected between the first stage output and input;

(f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

wherein said fourth stage is a non-inverting stage, said third stage being inverting and its output serving as the amplifier output, said fourth stage output being connected to the third inverting stage input, said first stage being inverting and its output being connected to the fourth stage input, said second stage being inverting and its output being connected to the first inverting stage input, said second inverting stage input serving as the amplifier input.

4. A high-quality amplifier circuit having an input and an output and comprising:

(a) a first stage having input and output connections;

(b) a second stage having input and output connections;

(c) a third stage having input and output connections;

(d) a fourth stage having input and output connections;

(e) a first Miller capacitor connected between the first stage output and input;

(f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

wherein said fourth stage is a non-inverting stage, said second stage being inverting and its output serving as the amplifier output, said third stage being inverting and its output being connected to the second inverting stage input, said fourth stage output being connected to the third inverting stage input, said first stage being inverting and its output being connected to the fourth stage input, said first inverting stage input serving as the amplifier input.

5. A high-quality amplifier circuit having an input and an output and comprising:

(a) a first stage having input and output connections;

(b) a second stage having input and output connections;

(c) a third stage having input and output connections;

(d) a fourth stage having input and output connections;

(e) a first Miller capacitor connected between the first stage output and input;

(f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

further comprising a fifth stage having input and output connections, said fifth stage input being connected to the input of the fourth stage, said fifth stage output being connected to the input of the first stage, said fifth stage being of the same signal transfer polarity as the fourth stage.

6. A high-quality amplifier circuit having an input and an output and comprising:

(a) a first stage having input and output connections;

(b) a second stage having input and output connections;

(c) a third stage having input and output connections;

(d) a fourth stage having input and output connections;

(e) a first Miller capacitor connected between the first stage output and input;

(f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

wherein the first, second and third Miller capacitors have values satisfying the following two equations:

$$gm2/Cm1 \geq (\frac{1}{2}) \cdot (gm1/C_{load}) \cdot (Cm2/Cm3), \text{ and}$$

$$gm4/Cm3 \geq (\frac{1}{2}) \cdot (gm2/Cm1) \cdot (Cm3/Cm2),$$

wherein $gm1$ is the transconductance of the first stage, $gm2$ is the transconductance of the second stage, $gm3$ is the transconductance of the third stage, $gm4$ is the transconductance of the fourth stage, $Cm1$, $Cm2$, and $Cm3$ are, respectively, the value of the first, second, and third Miller capacitors, and $C_{load}$ is the load capacitance of the first stage.

7. A high-quality amplifier circuit having an input and an output and comprising:

(a) a first stage having input and output connections;

(b) a second stage having input and output connections;

(c) a third stage having input and output connections;

(d) a fourth stage having input and output connections;

(e) a first Miller capacitor connected between the first stage output and input;

(f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

further comprising fifth and sixth stages each having input and output, a fourth Miller capacitor connecting the output and input of the fifth stage, and a fifth capacitor directly connecting the output of the sixth stage to the output of the first stage, the first through fifth stages being inverting stages.

8. A high-quality amplifier circuit having an input and an output and comprising:

(a) a first stage having input and output connections;

(b) a second stage having input and output connections;

(c) a third stage having input and output connections;

(d) a fourth stage having input and output connections;

(e) a first Miller capacitor connected between the first stage output and input;

(f) a second Miller capacitor connected between the third stage output and input;

(g) a third Miller capacitor connected between the first stage output and the third stage input;

(h) said first, second, and third stages being inverting stages; and (i) means for intercoupling given respective ones of said input and output connections so as to form said high-quality amplifier circuit;

further comprising fifth, sixth, seventh and eighth stages each having an input and an output, a fourth Miller capacitor connecting the output and input of the fifth stage, a fifth Miller capacitor connecting the output and input of the seventh stage, a sixth capacitor directly connecting the output of the eighth stage to the output of the fifth stage, and a seventh capacitor directly connecting the output of the eighth stage to the output of the first stage, the first through seventh stages being inverting stages.

9. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and said fourth, third, second and first amplifier stages being connected in cascade in the order named between said input terminal and said output terminal.

10. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and said third, second, first and fourth amplifier stages being connected in cascade in the order named between said input terminal and said output terminal.

11. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and said second, first, fourth and third amplifier stages are connected in cascade in the order named between said input terminal and said output terminal.

12. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output ok the amplifier stages comprising the first and last amplifier stages of the cascade, respectively; and wherein said first, second and third amplifier stages comprise inverting stages; and said first, fourth, third and second amplifier stages being connected in cascade in the order named between said input terminal and said output terminal.

13. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and said third capacitor being coupled between the output of the first amplifier stage and the input of the third amplifier stage such that three inverting amplifier stages are present between its capacitor terminals.

14. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and at most one of said amplifier stages comprising a differential amplifier stage.

15. The multistage amplifier circuit as claimed in claim 14, wherein the input amplifier stage comprises said differential amplifier stage and the output amplifier stage comprises a single-ended transistor amplifier stage.

16. The multistage amplifier circuit as claimed in claim 14, wherein the output amplifier stage comprises said differential amplifier stage and the input amplifier stage comprises a single-ended transistor amplifier stage.

17. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages;

a fifth amplifier stage being provided having an input coupled to said input terminal and an output coupled to the input of the output amplifier stage of the cascade; and said third capacitor functioning as a negative feedback circuit between the first and third amplifier stages.

18. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and the second amplifier stage being devoid of a capacitor between its output and input.

19. A multistage amplifier circuit with frequency compensation comprising:

an input terminal and an output terminal;

first, second, third and fourth amplifier stages connected in cascade, each amplifier stage having an input and an output;

a first capacitor coupled between the output and input of the first amplifier stage;

a second capacitor coupled between the output and input of the third amplifier stage;

a third capacitor coupled between the output of the first amplifier stage and the input of the third amplifier stage;

means for coupling said input terminal and said output terminal to the input and the output of the amplifier stages comprising the first and last amplifier stages of the cascade, respectively; and wherein said first, second and third amplifier stages comprise inverting stages; and the cascade connection including third, second and first amplifier stages, in the order named, between the input and output terminals.

* * * * *